(12) United States Patent
Luo

(10) Patent No.: US 12,745,459 B2
(45) Date of Patent: Sep. 22, 2026

(54) ARRAY SUBSTRATE WITH THIN FILM TRANSISTOR OF VERTICAL STRUCTURE AND DISPLAY PANEL THEREOF

(71) Applicant: Wuhan China Star Optoelectronics Technology Co., Ltd., Wuhan (CN)

(72) Inventor: Chengzhi Luo, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 650 days.

(21) Appl. No.: 17/618,580

(22) PCT Filed: Oct. 29, 2021

(86) PCT No.: PCT/CN2021/127541
§ 371 (c)(1),
(2) Date: Dec. 13, 2021

(87) PCT Pub. No.: WO2023/065392
PCT Pub. Date: Apr. 27, 2023

(65) Prior Publication Data

US 2024/0258340 A1 Aug. 1, 2024

(30) Foreign Application Priority Data

Oct. 22, 2021 (CN) ......................... 202111231111.X

(51) Int. Cl.
*H10D 86/60* (2025.01)
*H10D 86/40* (2025.01)

(52) U.S. Cl.
CPC ........... *H10D 86/60* (2025.01); *H10D 86/451* (2025.01); *H10D 86/423* (2025.01)

(58) Field of Classification Search
None
See application file for complete search history.

(56) References Cited

U.S. PATENT DOCUMENTS 6,846,709 B1 1/2005 Lojek
10,985,187 B1 * 4/2021 Nan .................. H01L 29/78696
(Continued)

FOREIGN PATENT DOCUMENTS

CN 1073806 A 6/1993
CN 109300915 A 2/2019
(Continued)

OTHER PUBLICATIONS

International Search Report in International application No. PCT/CN2021/127541, mailed on Jul. 21, 2022.
(Continued)

*Primary Examiner* — Sue A Purvis
*Assistant Examiner* — Seyon Ali-Simah Punchbeddell
(74) *Attorney, Agent, or Firm* — Menachem Nathan; Nathan & Associates

(57) ABSTRACT

A display panel and an array substrate are provided. The array substrate includes a first thin film transistor of a vertical structure. The first TFT includes a first source, an interlayer insulating layer, a first gate, a first drain, and a first active layer. The interlayer insulating layer covers the first source. A hole penetrates the interlayer insulating layer. The first gate is embedded in the interlayer insulating layer. The first drain is disposed on a side of the insulating layer away from the first source. The first active layer connects to the first source and the first drain via the hole.

16 Claims, 4 Drawing Sheets

(56) References Cited

U.S. PATENT DOCUMENTS

2014/0077298 A1* 3/2014 Ma .................... H01L 29/42384
257/347
2015/0378182 A1* 12/2015 Shin .................. H01L 29/78633
252/586
2017/0256649 A1 9/2017 Takamaru et al.
2018/0061994 A1* 3/2018 Shi .................... H01L 29/78618
2021/0210528 A1* 7/2021 Qu .......................... H01L 21/28
2021/0265439 A1* 8/2021 Peng ................. H01L 29/78696

FOREIGN PATENT DOCUMENTS

CN 112968061 A 6/2021
DE 3838355 A1 5/1990

OTHER PUBLICATIONS

Written Opinion of the International Search Authority in International application No. PCT/CN2021/127541, mailed on Jul. 22, 2022.
Chinese Office Action issued in corresponding Chinese Patent Application No. 202111231111.X dated Jan. 18, 2023, pp. 1-7.

* cited by examiner

ARRAY SUBSTRATE WITH THIN FILM TRANSISTOR OF VERTICAL STRUCTURE AND DISPLAY PANEL THEREOF

BACKGROUND

1. Field of the Disclosure

The present disclosure relates to the technical field, and more particularly, to an array substrate and a display panel.

2. Description of Related Art

Owing to features like high-resolution, compact, lightweight, and wide application, a liquid-crystal display (LCD) is widely applied in a variety of consumer electronics such as mobile phones, televisions (TVs), personal digital assistants (PDAs), digital cameras, notebook computers, desktop computers, and so on with the development of display technology. The LCD has become the mainstream product on the market.

A thin film transistor (TFT) is a primary driving component in the LCD display device, which is directly related to the development of a high-performance flat display device. The performance of the TFT used in the display device should be taken into consideration such as homogeneity, leakage current, effective driving length, area efficiency, and hysteresis. The TFT is divided into amorphous silicon (a-Si) TFT, low temperature poly-silicon (LTPS) TFT and metal oxide TFT according to material for an active layer in the display device. The LTPS TFT with advantages of high mobility, small size, fast charging, quick switching speed, etc., and is effective to gate-drive the LTPS TFT. The metal oxide TFT has the advantage of good uniformity and low leakage current, which is useful to display pixel-drive the metal oxide TFT.

Therefore, it is possible to produce a mixed TFT combined with an LTPS TFT driven by a gate and a metal oxide TFT driven by a display pixel. With the mixed TFT, the driving current flowing through the LCD gate-driving circuit is enhanced while the leakage current flowing through the LCD display pixel-driving circuit is lowered. A frequently used mixed TFT is an LTPS and indium gallium zinc oxide (IGZO) TFT. The carrier mobility of the IGZO is far below that of the LTPS so it is necessary to increase the size of the IGZO TFT to ensure the pixel charging rate. However, the design will bring a decrease in the aperture rate, which also limits the development of a high-end product like a high-resolution LCD.

SUMMARY

Technical Problem

The present disclosure proposes an array substrate and a display panel that can reduce the projective area of a first thin film transistor (TFT) in the direction of the array substrate, which helps improve the aperture rate of the display panel, thereby facilitating the development of displays with a high resolution.

Technical Solution

According to a first aspect of the present disclosure, an array substrate includes a first thin film transistor of a vertical structure. The first TFT includes a first source, an interlayer insulating layer, a first gate, a first drain, and a first active layer. The interlayer insulating layer covers the first source. A hole penetrates the interlayer insulating layer. The first gate is embedded in the interlayer insulating layer. The first drain is disposed on a side of the insulating layer away from the first source. The first active layer connects to the first source and the first drain via the hole.

In the array substrate of the present disclosure, the first active layer is disposed on a side wall and a bottom of the hole and extends to the interlayer insulating layer away from the first source.

In the array substrate of the present disclosure, the first gate is disposed around the first active layer arranged on the side wall of the hole.

In the array substrate of the present disclosure, a gate opening is disposed on the first gate. The hole is embedded in the gate opening. A projection of the gate opening perpendicular to a direction of the interlayer insulating layer is circular, and a projection of the hole perpendicular to a direction of the interlayer insulating layer is circular.

In the array substrate of the present disclosure, a drain opening corresponding to the hole is disposed on the first drain and covers part of the first active layer on the interlayer insulating layer away from the first source.

In the array substrate of the present disclosure, the interlayer insulating layer comprises a silicon nitride layer and a silicon oxide layer. The silicon nitride layer and the silicon oxide layer are disposed on the interlayer insulating layer from bottom to top. The first gate is disposed on the silicon nitride layer; the silicon oxide layer covers the first gate.

In the array substrate of the present disclosure, material of the first active layer comprises a metal oxide.

In the array substrate of the present disclosure, the array substrate further includes a display area and a non-display area. The first TFT is disposed on the display area. The array substrate further comprises a second TFT disposed on the non-display area. The second TFT comprises a second active layer, a second gate, a second source, and a second drain. The second gate and the first source are disposed in the same layer. The second source, the second drain, and the first drain are disposed in the same layer.

In the array substrate of the present disclosure, the second active layer and the second gate are correspondingly disposed; material of the second active layer comprises low-temperature polycrystalline silicon (LTPS).

In the array substrate of the present disclosure, the array substrate further comprises a substrate, a buffer layer disposed on the substrate, and a gate insulating layer disposed between the second active layer and the second gate. The second active layer is disposed on the buffer layer corresponds to the second gate. The first source is disposed on the gate insulating layer.

According to a second aspect of the present disclosure, a display panel includes an array substrate and an opposing substrate disposed opposite the array substrate. The array substrate includes a first thin film transistor of a vertical structure. The first TFT includes a first source, an interlayer insulating layer, a first gate, a first drain, and a first active layer. The interlayer insulating layer covers the first source. A hole penetrates the interlayer insulating layer. The first gate is embedded in the interlayer insulating layer. The first drain is disposed on a side of the insulating layer away from the first source. The first active layer connects to the first source and the first drain via the hole.

In the display panel of the present disclosure, the first active layer is disposed on a side wall and a bottom of the hole and extends to the interlayer insulating layer away from the first source.

In the display panel of the present disclosure, the first gate is disposed around the first active layer arranged on the side wall of the hole.

In the display panel of the present disclosure, a gate opening is disposed on the first gate. The hole is embedded in the gate opening. A projection of the gate opening perpendicular to a direction of the interlayer insulating layer is circular, and a projection of the hole perpendicular to a direction of the interlayer insulating layer is circular.

In the display panel of the present disclosure, a drain opening corresponding to the hole is disposed on the first drain and covers part of the first active layer on the interlayer insulating layer away from the first source.

In the display panel of the present disclosure, the interlayer insulating layer comprises a silicon nitride layer and a silicon oxide layer. The silicon nitride layer and the silicon oxide layer are disposed on the interlayer insulating layer from bottom to top. The first gate is disposed on the silicon nitride layer; the silicon oxide layer covers the first gate.

In the display panel of the present disclosure, material of the first active layer comprises a metal oxide.

In the display panel of the present disclosure, the array substrate further includes a display area and a non-display area. The first TFT is disposed on the display area. The array substrate further comprises a second TFT disposed on the non-display area. The second TFT comprises a second active layer, a second gate, a second source, and a second drain. The second gate and the first source are disposed in the same layer. The second source, the second drain, and the first drain are disposed in the same layer.

In the display panel of the present disclosure, the second active layer and the second gate are correspondingly disposed; material of the second active layer comprises low-temperature polycrystalline silicon (LTPS).

In the display panel of the present disclosure, the array substrate further comprises a substrate, a buffer layer disposed on the substrate, and a gate insulating layer disposed between the second active layer and the second gate. The second active layer is disposed on the buffer layer corresponds to the second gate. The first source is disposed on the gate insulating layer.

Advantageous Effects

Compared with the related art, a first TFT is of a vertical structure in an array substrate and a display panel proposed by the present disclosure. Specifically, a first source, a first active layer and a first drain in the first TFT are sequentially disposed in the direction perpendicular to the array substrate. A first gate is embedded in an interlayer insulating layer. The first active layer of the first TFT is electrically connected to the first source and the first drain via a hole penetrating the interlayer insulating layer, respectively. In this way, the length of the channel of the first TFT is equal to the thickness of the first gate, and the width of the channel of the first TFT is positively correlative to the aperture of the hole. This design ensures that the area of the first TFT projected in the direction of the array substrate is reduced based on higher mobility. Besides, the aperture ratio of the display panel effectively rises and displays of a high resolution are easily developed.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION OF THE EMBODIMENTS

Figure 1:
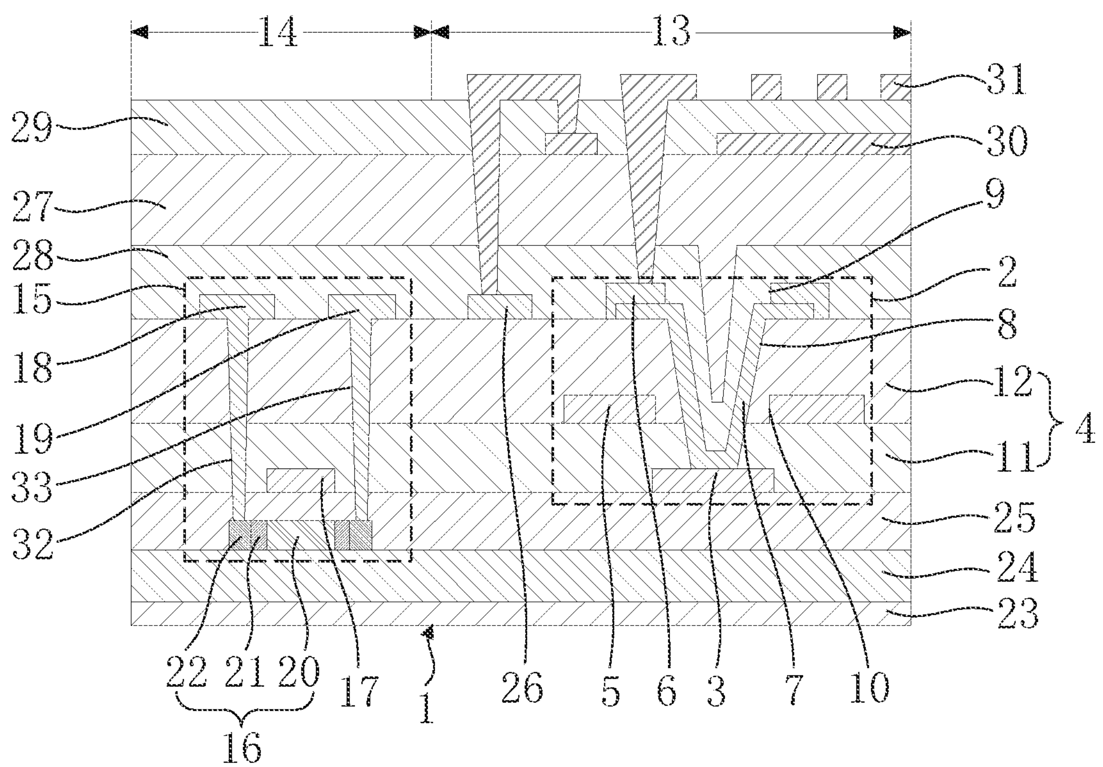
FIG. 1 illustrates a structure of an array substrate according to one embodiment of the present disclosure.

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

It is understood that terminologies, such as "center," "longitudinal," "horizontal," "length," "width," "thickness," "upper," "lower," "before," "after," "left," "right," "vertical," "horizontal," "top," "bottom," "inner," "outer," "clockwise," and "counterclockwise," are locations and positions regarding the figures. These terms merely facilitate and simplify descriptions of the embodiments instead of indicating or implying the device or components to be arranged on specified locations, to have specific positional structures and operations. These terms shall not be construed in an ideal or excessively formal meaning unless it is clearly defined in the present specification. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

All of the terminologies containing one or more technical or scientific terminologies have the same meanings that persons skilled in the art understand ordinarily unless they are not defined otherwise. For example, "arrange," "couple," and "connect," should be understood generally in the embodiments of the present disclosure. For example, "firmly connect," "detachably connect," and "integrally connect" are all possible. It is also possible that "mechanically connect," "electrically connect," and "mutually communicate" are used. It is also possible that "directly couple," "indirectly couple via a medium," and "two components mutually interact" are used.

All of the terminologies containing one or more technical or scientific terminologies have the same meanings that persons skilled in the art understand ordinarily unless they are not defined otherwise. For example, "upper" or "lower" of a first characteristic and a second characteristic may include a direct touch between the first and second characteristics. The first and second characteristics are not directly touched; instead, the first and second characteristics are touched via other characteristics between the first and second characteristics. Besides, the first characteristic arranged on/above/over the second characteristic implies that the first characteristic arranged right above/obliquely above or merely means that the level of the first characteristic is higher than the level of the second characteristic. The first characteristic arranged under/below/beneath the second characteristic implies that the first characteristic arranged right under/obliquely under or merely means that the level of the first characteristic is lower than the level of the second characteristic.

Different methods or examples are introduced to elaborate different structures in the embodiments of the present disclosure. To simplify the method, only specific components and devices are elaborated by the present disclosure. These embodiments are truly exemplary instead of limiting the present disclosure. Identical numbers and/or letters for reference are used repeatedly in different examples for simplification and clearance. It does not imply that the relations between the methods and/or arrangement. The methods proposed by the present disclosure provide a variety of examples with a variety of processes and materials. However, persons skilled in the art understand ordinarily that the application of other processes and/or the use of other kinds of materials are possible.

In FIG. 1, an array substrate 1 includes a first thin film transistor (TFT) 2 of a vertical structure. The first TFT 2 includes a first source 3, an interlayer insulating layer 4, a first gate 5, a first drain 6, and a first active layer 7. The interlayer insulating layer 4 covers the first source 3. A hole (i.e., a first hole 8) penetrates the interlayer insulating layer 4 and exposes the first source 3. The first gate 5 is embedded in the interlayer insulating layer 4 and at one side of the hole. The first drain 6 is disposed on one side of the insulating layer 4 away from the first source 3. part of the first active layer 7 is disposed in the hole and is electrically connected to the first source 3 and the first drain 6, respectively.

To distinguish from other holes, the first hole 8 penetrates the interlayer insulating layer 4 and exposes part of the first source 3.

The first active layer 7 is disposed on one side wall and one bottom of the first hole 8 and extends to the interlayer insulating layer 4 away from the first source 3. The first gate 5 is disposed around the first active layer 7 arranged on the side wall of the first hole 8. A drain opening 9 corresponding to the first hole 8 is disposed on the first drain 6 and covers part of the first active layer 7 on the interlayer insulating layer 4 away from the first source 3.

The projection of the first hole 8 is circular in the direction perpendicular to the array substrate 1. It is worth notifying that the projective shape of the first hole 8 in the direction perpendicular to the array substrate 1 is not limited while the present embodiment gives an example of a circular shape. It is understanding that a gate opening 10 is disposed on the first gate 5, and the first hole 8 is embedded in the gate opening 10 so that the first gate 5 is disposed around the first active layer 7 disposed on the side wall of the first through hole 8. Specifically, the gate opening 10 can be circular although it is not limited in reality.

The length of the first active layer 7 is equal to the thickness of the first gate 5, and the width of the channel of the first active layer 7 is equal to the circumference of the first hole 8 of the interlayer insulating layer 4 in the present embodiment. The active layer in the TFT of the related art is typically disposed in the same plane so the length of the channel of the active layer is equal to the width of the gate opposite to the active layer, and the width of the channel of the active layer is equal to the length of the active layer. Therefore, the first TFT 2 proposed in the present embodiment is smaller than the projective area perpendicular to the array substrate 1 as compared with the TFT of the related art with the same channel size. The arrangement of the first TFT 2 in the display area effectively improves the aperture rate, which is advantageous for the development of high resolution products.

The first gate 5 is comprised of molybdenum (Mo), aluminum (Al) or titanium (Ti). Additionally, the first gate 5 is comprised of an alloy of Mo, Al and Ti, or a laminated structure composed of Mo, Al, and Ti.

The thickness of the first gate 5 ranges from 0.5 to 5 microns. The diameter of the gate opening 10 of the first gate 5 ranges from 1 to 10 microns. The diameter of the first hole 8 penetrating the interlayer insulating layer 4 is 0.2 to 1 microns less than the diameter of the gate opening 10 of the first gate 5.

The interlayer insulating layer 4 includes a silicon nitride layer 11 and a silicon oxide layer 12. The silicon nitride layer 11 and the silicon oxide layer 12 are disposed on the interlayer insulating layer 4 from bottom to top. The first gate 5 is disposed on the silicon nitride layer 11, and the silicon oxide layer 12 covers the first gate 5 such that the first gate 5 is fully wrapped by the nitride layer 11 and the silicon oxide layer 12.

The first drain 6 is circular. The first active layer 7 disposed on the interlayer insulating layer 4 away from the first source 3 is also circular. The first drain 6 is electrically connected to the interlayer insulating layer 4 away from the first source 3.

The array substrate 1 includes a display area 13 and a non-display area 14. The first TFT 2 is disposed on the display area 13 for displaying pixel drive. The array substrate 1 further includes the second TFT 15 disposed on the non-display area 14. The second TFT 15 drives the gate.

The second TFT 15 includes a second active layer 16, a second gate 17, a second source 18, and a second drain 19. The second gate 17 and the first source 3 are arranged in the same layer. The second source 18, the second drain 19, and the first drain 6 are arranged in the same layer.

The first active layer 7 is comprised of a metal oxide such as indium gallium zinc oxide (IGZO). The second active layer 16 is comprised of a low-temperature polycrystalline silicon (LTPS). The array substrate 1 is gate-driven by an LTPS TFT and display pixel-driven by a metal oxide TFT, which improves the driving current in the gate driving circuit of the display panel while reduces the leakage current of the driven display panel.

The second active layer 16 includes a poly-silicon area 20, an N-type light-doped area 21 and an N-type heavy-doped area 22. The N-type light-doped area 21 is disposed on both sides of the poly-silicon area 20. The N-type heavy-doped area 22 is disposed on each of the N-type light-doped areas 21 away from the poly-silicon area 20. The second source 18 and the second drain 19 are connected to two of the N-type heavy-doped areas 22, respectively. The structure of the second active layer 16 is not limited specifically.

The array substrate 1 further includes a substrate 23, a buffer layer 24, a gate insulating layer 25, a passivation layer, a flat layer 27 and a transparent electrode layer. The buffer layer 24 is disposed on the substrate 23. The gate insulating layer 25 is disposed between the second active layer 16 and the second gate 17. The passivation layer, the flat layer 27 and the transparent electrode layer are sequentially disposed on the interlayer insulating layer 4 where the first drain 6 is formed. The substrate 23 may be, and is not limited to, a glass substrate. The second active layer 16 disposed on the buffer layer 24 corresponds to the second gate 17. The first source 3 is disposed on the gate insulating layer 25.

Further, the array substrate 1 may include a touch electrode 26 disposed in the same layer where the first drain 6 is arranged. The passivation layer includes a first passivation layer 28 and a second passivation layer 29. The transparent electrode layer includes a first transparent electrode layer 30 and a second transparent electrode layer 31. The first passivation layer 28 is disposed on the interlayer insulating layer 4 formed with the first drain 6. The flat layer 27 is disposed on the first passivation layer 28. The first transparent electrode layer 30 is disposed on the flat layer 27 and the second passivation. The layer 29 is disposed on the first transparent electrode layer 30 and the flat layer 27. The second transparent electrode layer 31 is disposed on the second passivation layer 29. The first transparent electrode layer 30 includes a plurality of bottom transparent electrodes. The second transparent electrode layer 31 includes a plurality of top transparent electrodes. Specifically, one part of the transparent electrode is electrically connected to the first drain 6 through the hole of the first passivation layer 28, the flat layer 27, and the second passivation layer 29 to make the display function work. The other part of the top transparent electrode is electrically connected to the part of the bottom transparent electrode via the hole penetrating the second passivation layer 29. Further, the part of the top transparent electrode is electrically connected to the touch electrode 26 via the hole penetrating the first passivation layer 28, the flat layer 27 and the second passivation layer 29 to make the touch function work.

Reference to FIG. 2 to FIG. 8, the process of producing the array substrate 1 is introduced as follows.

Figure 2:
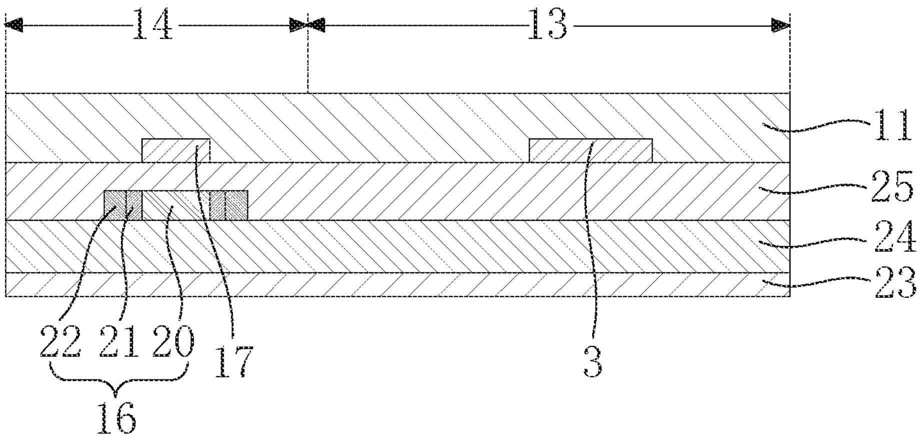
FIG. 2 illustrates the structure of the array substrate with a formed silicon nitride layer according to one embodiment of the present disclosure.

In FIG. 2, the buffer layer 24, the second active layer 16, and the gate insulating layer 25 are sequentially formed on the substrate 23. Afterwards, the first metal layer is deposited on the gate insulating layer 25, and the first metal layer is patterned to produce a first source 3 in the display area and the second gate 17 corresponding to the second active layer 16 in the non-display area 14, respectively. Afterwards, the silicon nitride layer 11 is deposited on the gate insulating layer 25 where the first source 3 and the second gate 17 are formed.

Figure 3:
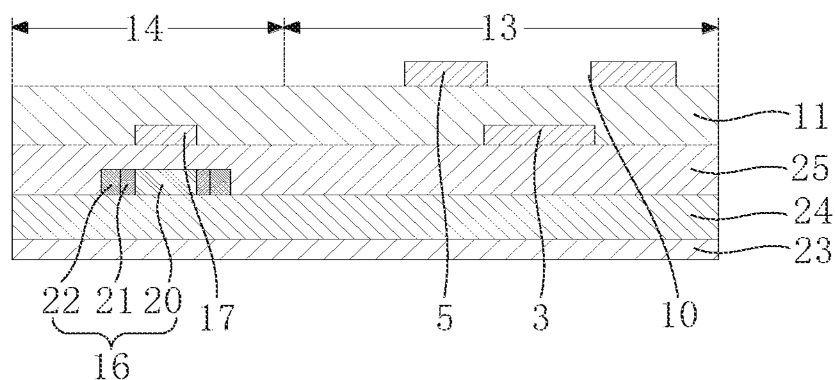
FIG. 3 illustrates the structure of the array substrate with a formed first gate according to one embodiment of the present disclosure.
Figure 4:
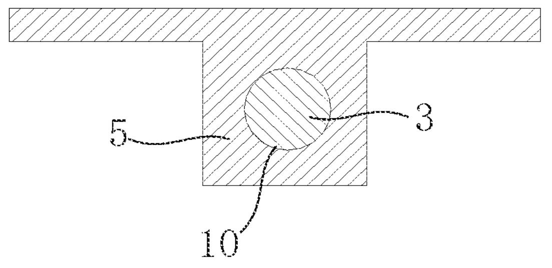
FIG. 4 illustrates a schematic diagram showing a top position of the first gate and the first source illustrated in FIG. 3 according to one embodiment of the present disclosure.

In FIG. 3 and FIG. 4, the second metal layer is deposited based on the previous step, and the second metal layer is patterned to form the first gate 5 with the gate opening 10. The gate opening 10 and the first source 3 are disposed correspondingly, and the positive projection of the gate opening 10 on the substrate 23 covers part of the positive projection of the first source 3 on the substrate 23.

Figure 5:
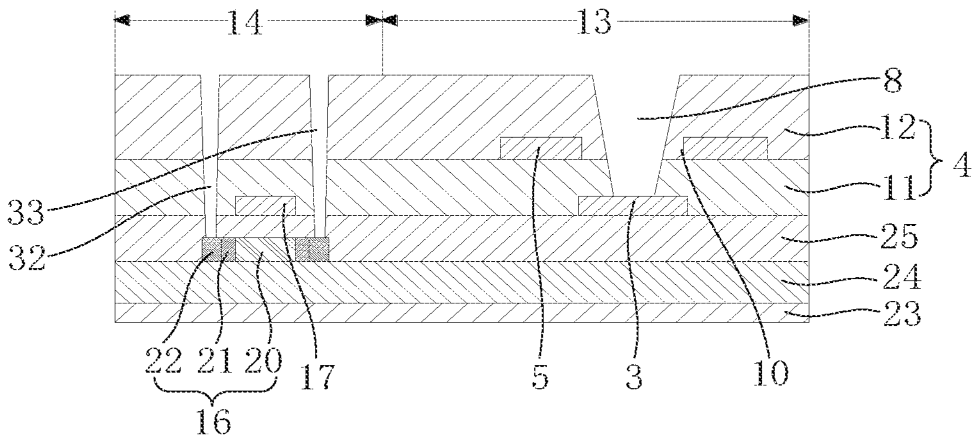
FIG. 5 illustrates the structure of the array substrate with a formed first hole according to one embodiment of the present disclosure.

In FIG. 5, the silicon oxide layer 12 is deposited on the silicon nitride layer 11 with the first gate 5 based on the previous step, and the silicon nitride layer 11 and the silicon oxide layer 12 forms an interlayer insulating layer 4. Afterwards, the interlayer insulating layer 4 is digged and formed in the display area 13 and the non-display area 14, and part of the first hole 8 of the first source 3 disposed in the display area 13 is exposed. Also, the second through hole 32 and the third through hole 33 of the two N-type heavy-doped areas 22 of the second active layer 16 are exposed, respectively.

Figure 6:
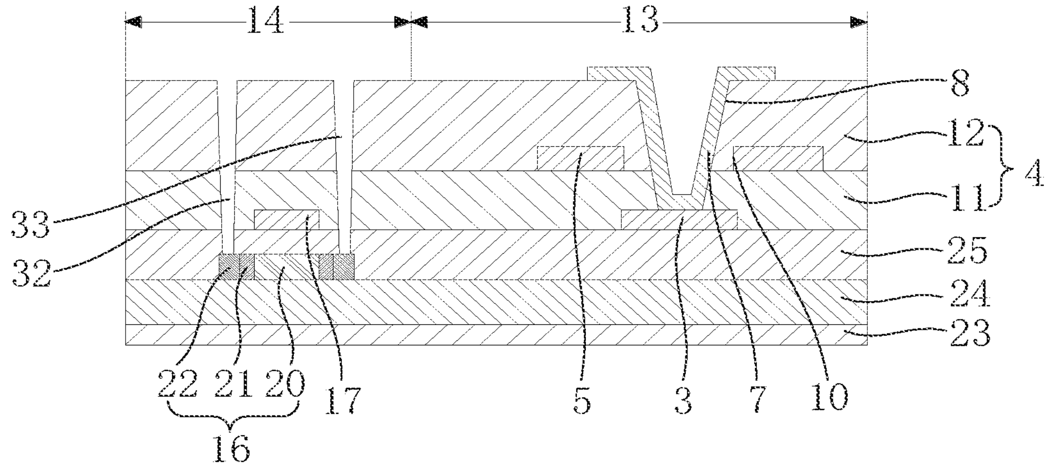
FIG. 6 illustrates the structure of the array substrate with a formed active layer according to one embodiment of the present disclosure.

In FIG. 6, the metal oxide layer is deposited and the metal oxide layer is patterned based on the previous step, thereby forming the first active layer 7 on a side wall and a bottom of the first hole 8 and extending to the silicon oxide layer 12 away from the first source 3. The first active layer 7 is electrically connected to the first source 3 at the bottom of the first hole 8.

Figure 7:
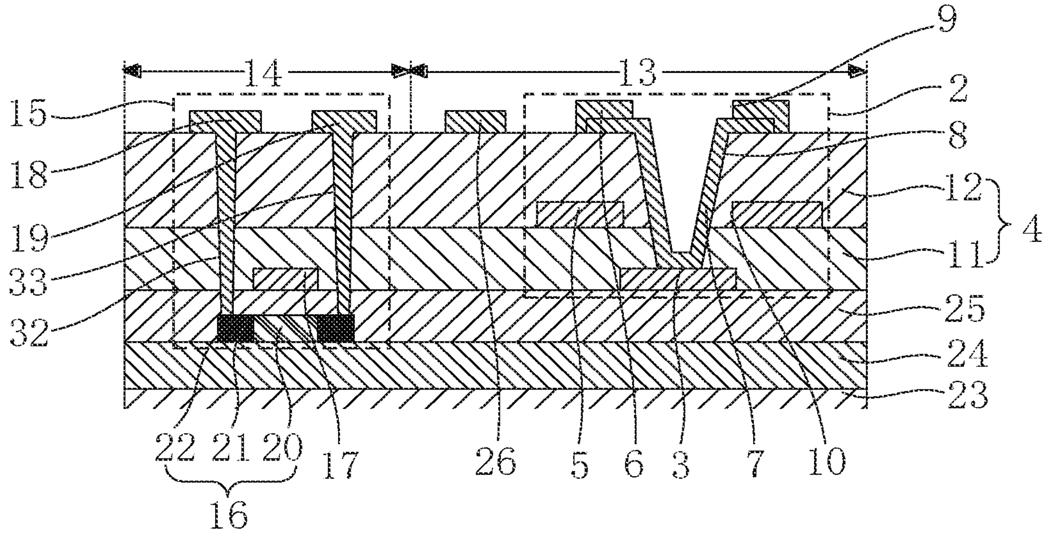
FIG. 7 illustrates the structure of the array substrate with a formed first drain according to one embodiment of the present disclosure.

In FIG. 7, the third metallic layer is deposited and the third metallic layer is patterned based on the previous step, thereby forming the first drain 6 in the display area 13 and the second source 18 and the second drain 19 disposed in the non-display area 14. The first drain 6 partially covers the first active layer 7 on the silicon oxide layer 12 away from the first source 3. A drain opening 9 corresponding to the first through hole 8 is disposed on the first drain 6. The second source 18 and the second drain 19 are electrically connected to the two N-type heavy-doped areas 22 of the second active layer 16 via the second hole 32 and the third hole 33, respectively.

Figure 8:
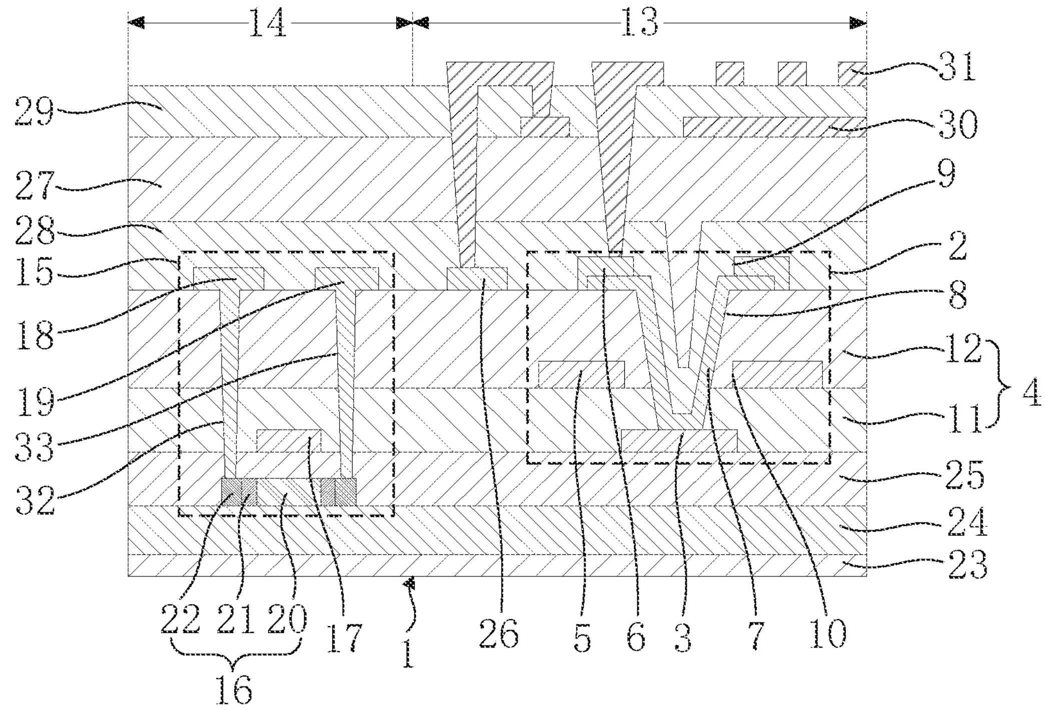
FIG. 8 illustrates the structure of the array substrate with a formed first transparent electrode layer according to one embodiment of the present disclosure.

In FIG. 8, the first passivation layer 28, the flat layer 27, the first transparent electrode layer 30, the second passivation layer 29, and the second transparent electrode layer 31 are sequentially produced on the previous step. The flat layer 27 is filled in the first hole 8 to make sure that the film layer is flat.

In the present embodiment, the first TFT 2 is of a vertical structure. Specifically, the first source 3, the first active layer 7, and the first drain 6 in the first TFT 2 are sequentially disposed in the direction perpendicular to the array substrate 1. The first gate 5 is embedded in the interlayer insulating layer 4. The first active layer 7 of the first TFT 2 is electrically connected to the first source 3 and the first drain 6 via the hole penetrating the interlayer insulating layer 4, respectively. In this way, the length of the channel of the first TFT 2 is equal to the thickness of the first gate 5, and the width of the channel of the first TFT 2 is positively correlative to the aperture of the hole; for example, the width of the channel of the first TFT 2 is equal to the circumference of the hole. This kind of design ensures that the area of the first TFT 2 projected in the direction of the array substrate 1 is reduced based on higher mobility. In addition, the aperture ratio of the display panel effectively rises and displays of a high resolution are easily developed.

Further, the first TFT 2 and a transistor different from the second TFT 15 are adopted together. In addition, the second TFT 15 on the array substrate is not confined to what is proposed by the present embodiment. The first active layer and the second active layer are not limited to what is proposed by the present embodiment, either.

Figure 9:
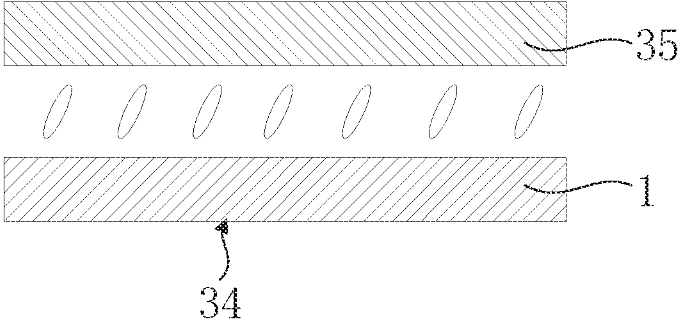
FIG. 9 illustrates the structure of a display panel according to one embodiment of the present disclosure.

In FIG. 9, the present embodiment further proposes a display panel 34 including an array substrate 1 and an opposing substrate 35 disposed opposite the array substrate 1, which are both introduced in the above embodiment.

The opposing substrate 35 includes a color film substrate. The display panel 34 further includes a liquid crystal layer disposed between the array substrate 1 and the opposite substrate 35.

The structure of the first TFT 2 is of a vertical structure, which ensures that the area of the first TFT 2 projected in the direction of the array substrate 1 is reduced based on higher mobility. In this way, the aperture ratio of the display panel 34 effectively raises and the display panel 34 of a high resolution can be easily developed.

Above are embodiments of the present invention, which does not limit the scope of the present invention. Any modifications, equivalent replacements or improvements within the spirit and principles of the embodiment described above should be covered by the protected scope of the invention.

What is claimed is:

1. An array substrate, comprising a first thin film transistor (TFT) of a vertical structure, the first TFT comprising:

a first source;

an interlayer insulating layer, covering the first source, wherein a hole penetrates the interlayer insulating layer to expose part of the first source;

a first gate, fully embedded in the interlayer insulating layer and at a side of the hole;

a first drain, disposed on an outer side of the interlayer insulating layer away from the first source; and a first active layer, part of the first active layer being disposed in the hole and being electrically connected to the first source and the first drain;

wherein the first drain covers another part of the first active layer, wherein the other part of the first active layer is on an outer surface of the interlayer insulating layer away from the first source;

wherein the first active layer is disposed on a side wall and a bottom of the hole and extends to the interlayer insulating layer away from the first source;

wherein the first gate is disposed around the first active layer arranged on the side wall of the hole;

wherein the other part of the first active layer that is covered by the first drain is not disposed in the hole.

2. The array substrate of claim 1, wherein a gate opening is disposed on the first gate; the hole is embedded in the gate opening;

a projection of the gate opening perpendicular to a direction of the interlayer insulating layer being circular, and a projection of the hole perpendicular to a direction of the interlayer insulating layer being circular.

3. The array substrate of claim 1, wherein a drain opening corresponding to the hole is disposed on the first drain.

4. The array substrate of claim 1, wherein the interlayer insulating layer comprises a silicon nitride layer and a silicon oxide layer; the silicon nitride layer and the silicon oxide layer are disposed on the interlayer insulating layer from bottom to top; the first gate is disposed on the silicon nitride layer; the silicon oxide layer covers the first gate.

5. The array substrate of claim 1, wherein material of the first active layer comprises a metal oxide;

wherein the first drain is in contact with a surface of the interlayer insulating layer facing away from and towards a direction perpendicular to a top surface of the first source, and the other part of the first active layer is in contact with the surface of the interlayer insulating layer facing away from and towards a direction perpendicular to the top surface of the first source.

6. The array substrate of claim 1, further comprising a display area and a non-display area; the first TFT is disposed on the display area; the array substrate further comprises a second TFT disposed on the non-display area;

the second TFT comprises a second active layer, a second gate, a second source, and a second drain; the second gate and the first source are disposed in a same layer; the second source, the second drain, and the first drain are disposed in another same layer.

7. The array substrate of claim 6, wherein the second active layer and the second gate are correspondingly disposed; material of the second active layer comprises low-temperature polycrystalline silicon (LTPS).

8. The array substrate of claim 6, further comprising a substrate, a buffer layer disposed on the substrate, and a gate insulating layer disposed between the second active layer and the second gate;

the second active layer disposed on the buffer layer corresponds to the second gate; the first source is disposed on the gate insulating layer.

9. A display panel comprising an array substrate and an opposing substrate disposed opposite the array substrate, the array substrate comprising a first thin film transistor (TFT) of a vertical structure, the first TFT comprising:

a first source;

an interlayer insulating layer, covering the first source, wherein a hole penetrates the interlayer insulating layer to expose part of the first source;

a first gate, fully embedded in the interlayer insulating layer and at a side of the hole;

a first drain, disposed on an outer side of the interlayer insulating layer away from the first source; and a first active layer, part of the first active layer being disposed in the hole and being electrically connected to the first source and the first drain;

wherein the first drain covers another part of the first active layer, wherein the other part of the first active layer is on an outer surface of the interlayer insulating layer away from the first source;

wherein the first active layer is disposed on a side wall and a bottom of the hole and extends to the interlayer insulating layer away from the first source;

wherein the first gate is disposed around the first active layer arranged on the side wall of the hole;

wherein the other part of the first active layer that is covered by the first drain is not disposed in the hole.

10. The display panel of claim 9, wherein a gate opening is disposed on the first gate; the hole is embedded in the gate opening;

a projection of the gate opening perpendicular to a direction of the interlayer insulating layer being circular, and a projection of the hole perpendicular to a direction of the interlayer insulating layer being circular.

11. The display panel of claim 9, wherein a drain opening corresponding to the hole is disposed on the first drain.

12. The display panel of claim 9, wherein the interlayer insulating layer comprises a silicon nitride layer and a silicon oxide layer; the silicon nitride layer and the silicon oxide layer are disposed on the interlayer insulating layer from bottom to top; the first gate is disposed on the silicon nitride layer; the silicon oxide layer covers the first gate.

13. The display panel of claim 9, wherein material of the first active layer comprises a metal oxide.

14. The display panel of claim 9, wherein the array substrate comprises a display area and a non-display area;

the first TFT is disposed on the display area; the array substrate further comprises a second TFT disposed on the non-display area;

the second TFT comprises a second active layer, a second gate, a second source, and a second drain; the second gate and the first source are disposed in a same layer; the second source, the second drain, and the first drain are disposed in another same layer.

15. The display panel of claim 14, wherein the second active layer and the second gate are correspondingly disposed; material of the second active layer comprises low-temperature polycrystalline silicon (LTPS).

16. The display panel of claim 14, wherein the array substrate further comprises a substrate, a buffer layer disposed on the substrate, and a gate insulating layer disposed between the second active layer and the second gate;

the second active layer disposed on the buffer layer corresponds to the second gate; the first source is disposed on the gate insulating layer.

* * * * *